(12) United States Patent
Tanaka et al.

(10) Patent No.: US 6,829,130 B2
(45) Date of Patent: Dec. 7, 2004

(54) POWER SUPPLY APPARATUS FOR SUPPLYING ELECTRIC POWER TO SUBSTRATE CARRIER CONTAINER

(75) Inventors: Akira Tanaka, Tokyo (JP); Takashi Kishi, Tokyo (JP)

(73) Assignee: Ebara Corporation, Tokyo (JP)

( * ) Notice: Subject to any disclaimer, the term of this patent is extended or adjusted under 35 U.S.C. 154(b) by 322 days.

(21) Appl. No.: 09/987,383

(22) Filed: Nov. 14, 2001

(65) Prior Publication Data

US 2002/0057021 A1 May 16, 2002

(30) Foreign Application Priority Data

Nov. 15, 2000 (JP) ......................................... 2000-348597

(51) Int. Cl.⁷ ................................................. H05F 3/00
(52) U.S. Cl. ........................................ 361/230; 361/235
(58) Field of Search ................................. 361/230, 231, 361/232, 233, 234, 235, 212, 18; 307/116

(56) References Cited

U.S. PATENT DOCUMENTS

| | | | | |
|---|---|---|---|---|
| 4,770,680 A | * | 9/1988 | Machida et al. | 55/385.1 |
| 5,636,960 A | * | 6/1997 | Hiroki et al. | 414/781 |
| 5,843,196 A | * | 12/1998 | Leavey et al. | 55/356 |
| 6,068,668 A | * | 5/2000 | Mastroianni | 29/25.01 |
| 6,364,922 B1 | | 4/2002 | Tanaka et al. | |
| 6,427,096 B1 | * | 7/2002 | Lewis et al. | 700/228 |
| 6,446,806 B1 | * | 9/2002 | Ohori et al. | 206/454 |
| 6,521,007 B1 | | 2/2003 | Tanaka et al. | |
| 6,547,953 B2 | | 4/2003 | Suzuki et al. | |
| 6,654,122 B1 | * | 11/2003 | Hanson et al. | 356/614 |

FOREIGN PATENT DOCUMENTS

| | | |
|---|---|---|
| EP | 0246587 | 11/1987 |
| EP | 0509256 | 10/1992 |
| EP | 0854498 | 7/1998 |
| EP | 1035574 | 9/2000 |
| JP | 62-269334 | 11/1987 |
| JP | 01-207944 | 8/1989 |
| JP | 11-217119 | 8/1999 |
| JP | 2000-188320 | 7/2000 |
| JP | 2001-077188 | 3/2001 |
| JP | 2002-122382 | 4/2002 |
| JP | 2002-261159 | 9/2002 |

* cited by examiner

*Primary Examiner*—Brian Sircus
*Assistant Examiner*—Danny Nguyen
(74) *Attorney, Agent, or Firm*—Wenderoth, Lind & Ponack, L.L.P.

(57) ABSTRACT

A power supply apparatus supplies electric power to a substrate carrier container having a rechargeable cell. The power supply apparatus comprises a body for seating a substrate carrier container thereon, a seating detecting device provided on the body for detecting whether the substrate carrier container is seated on the body or not, and a power supply connector movably provided on the body. The power supply apparatus further comprises a control mechanism for bringing the power supply connector into contact with a charging terminal of the substrate carrier container to charge the rechargeable cell in the substrate carrier container according to a detected signal from the seating detecting device.

8 Claims, 4 Drawing Sheets

POWER SUPPLY APPARATUS FOR SUPPLYING ELECTRIC POWER TO SUBSTRATE CARRIER CONTAINER

BACKGROUND OF THE INVENTION

1. Field of the Invention

The present invention relates to a substrate carrier container equipped with an electrically operable component, for temporarily storing or carrying a workpiece, such as a semiconductor substrate, a photomask, or a magnetic disk. More particularly, the present invention relates to an apparatus for and a method of supplying electric power from an external power source to a substrate carrier container, and to an apparatus for and a method of charging a secondary cell in a substrate carrier container.

2. Description of the Related Art

In many cases, highly hermetically sealed containers are used for carrying and storing substrates, such as semiconductor substrates or glass substrates, which are being fabricated in semiconductor fabrication factories. Such a highly hermetically sealed container basically serves to protect the stored substrates from contaminants that are present outside of the containers. Contaminants are also produced from the material of the container and the stored substrates, and attached to the inner surface of the container. Therefore, unless the container is frequently cleaned, the contaminants attached to the inner surface of the container tend to contaminate a clean substrate that is stored in the container and is to be differently processed in a next process. Those highly hermetically sealed containers are usually equipped with no electrical component such as an electronic air cleaner.

As semiconductor devices on semiconductor substrates become smaller in size and different interconnection materials are used on the semiconductor substrates, it is necessary to employ a control device for reducing contaminants other than particulate contaminants, e.g., gaseous contaminants or native oxide formed in the presence of oxygen and water. A combination of a fan motor, a particle removal filter, a gas removal filter, and the like can reduce gaseous contaminants, and a substrate carrier container having such a combination has commercially been available. In another method of reducing gaseous contaminants, particulate contaminants are removed with ultraviolet photoelectrons, and organic substances are decomposed into harmless substances with a photocatalyst. There has been proposed a substrate carrier container having a device that can perform these processes. Further, there has also been commercially available a portable desiccator having a recoverable dehumidifying agent or an electronic dehumidifying unit. Presently available portable containers having such functions for reducing contaminants are usually equipped with a rechargeable secondary cell or are supplied with electric power from an external power source to energize an air cleaner or the like. Since those portable containers have not been designed from the viewpoint of automatic operation in semiconductor fabrication factories, connection terminals for charging the secondary cells or supplying electric power from the external power source are connected and disconnected directly by an operator in many cases.

Generally, a portable device and an industrial device equipped with a secondary cell cannot be operated continuously unless the secondary cell is charged. For example, a small lightweight device having a secondary cell, such as a portable telephone or an electrically operated toothbrush, is directly placed on a charger to charge the secondary cell in the device. Many connectors for connecting the portable device to the charger use a fixed leaf spring because the device is lightweight, the charging current is low, the device is placed directly on the charger by an operator, and the connector has a low requirement for reliability.

An industrial device equipped with a secondary cell tends to be large in size, consume a large current, and have a high requirement for reliability. Therefore, many industrial devices use sockets and plugs for connection to chargers. In the case where a connector in a device equipped with a secondary cell is not connected by an operator, i.e., the connector is connected by a robot or an automatic moving mechanism in an automated factory, for example, a highly reliable connection can be established only when the device has an accurate positioning mechanism and a highly durable connector. Since a medium-sized device or a large-sized device generally has a large space therein for a connector, the dimensions of the accurate positioning mechanism and the connector do not pose significant problems. However, a small-sized device such as a substrate carrier container does not have a large space therein for a connector. Therefore, it is necessary to make efforts to establish a highly reliable connection within a relatively small space.

A substrate carrier container that accommodates twenty-five 8-inch substrates weighs about 5 kg, and a substrate carrier container that accommodates twenty-five 12-inch substrates weighs about 10 kg. In an automated semiconductor fabrication factory, a substrate carrier container is mechanically handled and transported by a transportation machine such as an automated guided vehicle (AGV) or an overhead hoisting transfer (OHT). When the substrate carrier container is transported and seated on a power supply apparatus with the use of such a transportation machine, there is a strong possibility that a connection terminal for connecting the substrate carrier container to the power supply apparatus is damaged due to the shock caused by seating action. Particularly, a spring-type charging connector is prone to be damaged in such an environment.

SUMMARY OF THE INVENTION

It is therefore an object of the present invention to provide a power supply apparatus which can highly reliably supply electric power to a substrate carrier container equipped with a rechargeable secondary cell and an air cleaner energized by the secondary cell or a substrate carrier container equipped with an air cleaner energized by an external power source.

According to a first aspect of the present invention, there is provided a power supply apparatus for supplying electric power to a substrate carrier container having a rechargeable cell, comprising: a body for seating a substrate carrier container thereon; a seating detecting device provided on the body for detecting whether the substrate carrier container is seated on the body or not; a power supply connector movably provided on the body; and a control mechanism for bringing the power supply connector into contact with a charging terminal of the substrate carrier container to charge the rechargeable cell in the substrate carrier container according to a detected signal from the seating detecting device.

According to a second aspect of the present invention, there is provided a power supply apparatus for supplying electric power to a substrate carrier container having an electrical component energized by an external power source, comprising: a body for seating a substrate carrier container thereon; a seating detecting device provided on the body for detecting whether the substrate carrier container is seated on the body or not; a power supply connector movably provided on the body; and a control mechanism for bringing the power supply connector into contact with a power supply terminal of the substrate carrier container to supply electric power to the electrical component according to a detected signal from the seating detecting device.

Preferably, the substrate carrier container has at least one of an air cleaner and a dehumidifying device disposed therein. It is desirable that the seating detecting device comprises at least one of a mechanical switch, a proximity switch, and a photoelectric sensor. Preferably, the power supply connector comprises a fitting-type connector or a contact-type connector.

According to a third aspect of the present invention, there is provided a method of supplying electric power to a substrate carrier container having a rechargeable cell, comprising: seating a substrate carrier container on an body of a power supply apparatus; detecting whether the substrate carrier container is seated on the body with a seating detecting device provided on the body or not; moving a power supply connector provided on the body to bring the power supply connector into contact with a charging terminal of the substrate carrier container; charging the rechargeable cell in the substrate carrier container according to a detected signal from the seating detecting device; and returning the power supply connector to an original position thereof after the rechargeable cell is charged.

According to a fourth aspect of the present invention, there is provided a method of supplying electric power to a substrate carrier container having an electrical component energized by an external power source, comprising: seating a substrate carrier container on an body of a power supply apparatus; detecting whether the substrate carrier container is seated on the body with a seating detecting device provided on the body or not; moving a power supply connector provided on the body to bring the power supply connector into contact with a power supply terminal of the substrate carrier container; supplying electric power to the electrical component according to a detected signal from the seating detecting device; and returning the power supply connector to an original position thereof after the electric power is supplied to the electrical component.

With the above arrangement of the present invention, the power supply apparatus comprises the seating detecting device for detecting whether the substrate carrier container is seated in a predetermined position on the power supply apparatus. According to detected information from the seating detecting device, the power supply connector of the power supply apparatus is moved to be brought into contact with the power supply terminal of the substrate carrier container. Thus, the secondary cell is charged, or the electrical component energized by an external power source is supplied with electric power. When the charging of the cell or the supply of electric power to the electrical component is completed, or when the substrate carrier container is moved from the power supply apparatus, the power supply connector is returned to its original position. Therefore, the power supply connector is prevented from being damaged, and a highly reliable connection can be established.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENT

A power supply apparatus for supplying electric power to a substrate carrier container according to an embodiment of the present invention will be described below with reference to FIGS. 1 through 6.

Figure 1:
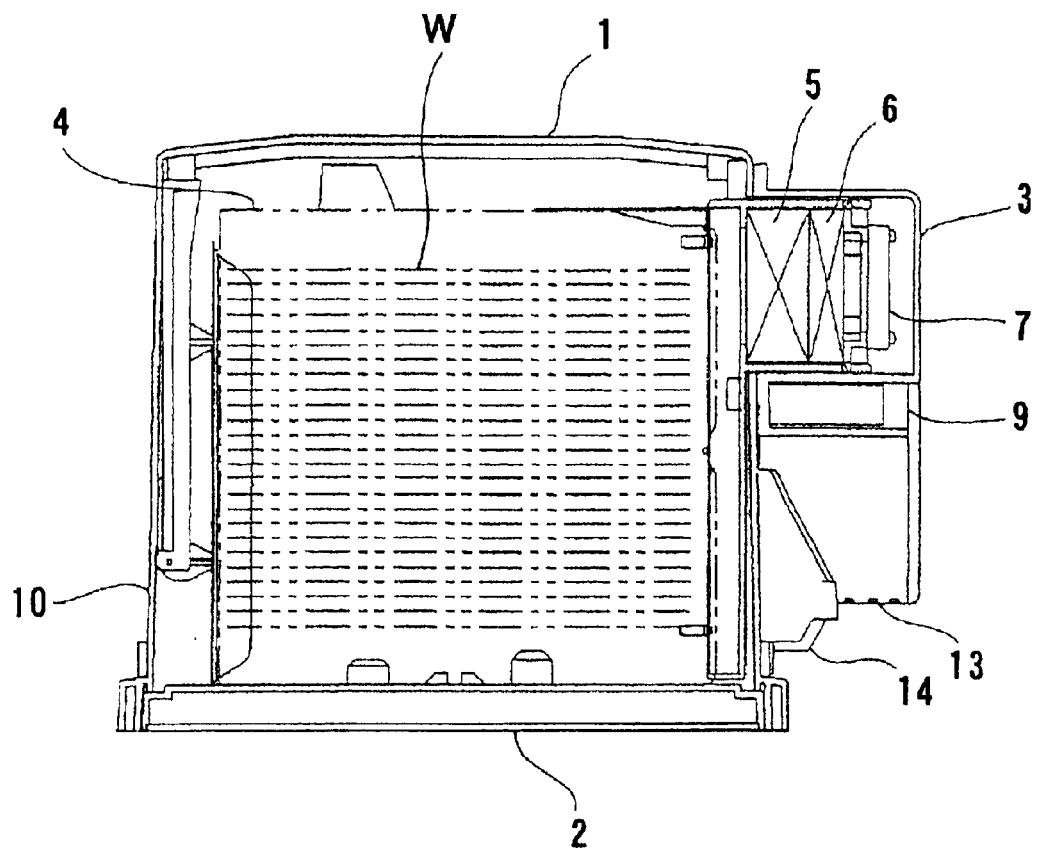
FIG. 1 is a cross-sectional side view showing a substrate carrier container equipped with an air cleaner and a dehumidifying unit according to an embodiment of the present invention.
Figure 2:
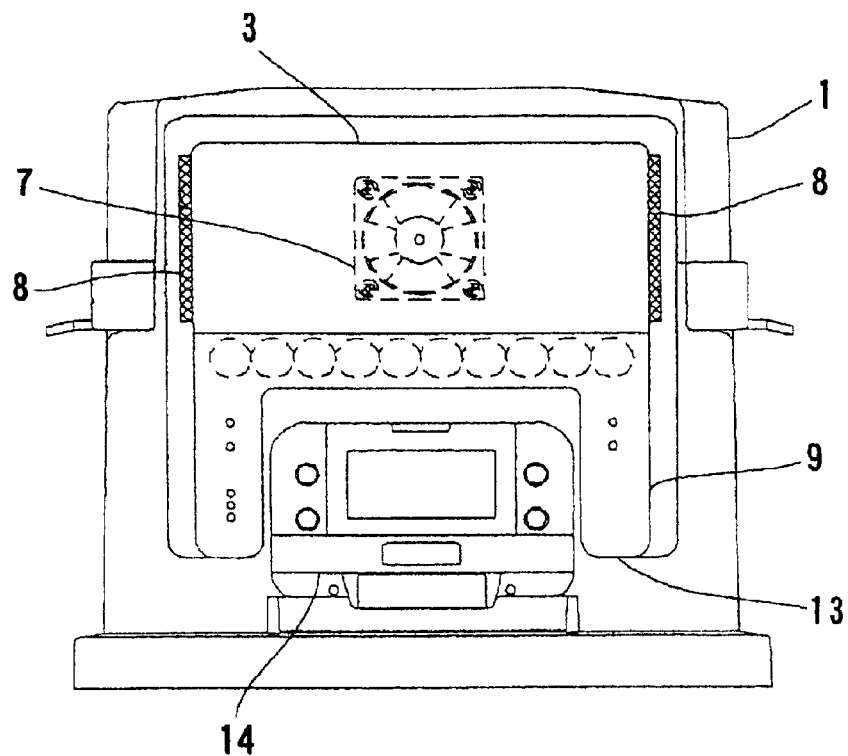
FIG. 2 is a rear view of the substrate carrier container shown in FIG. 1.
Figure 3:
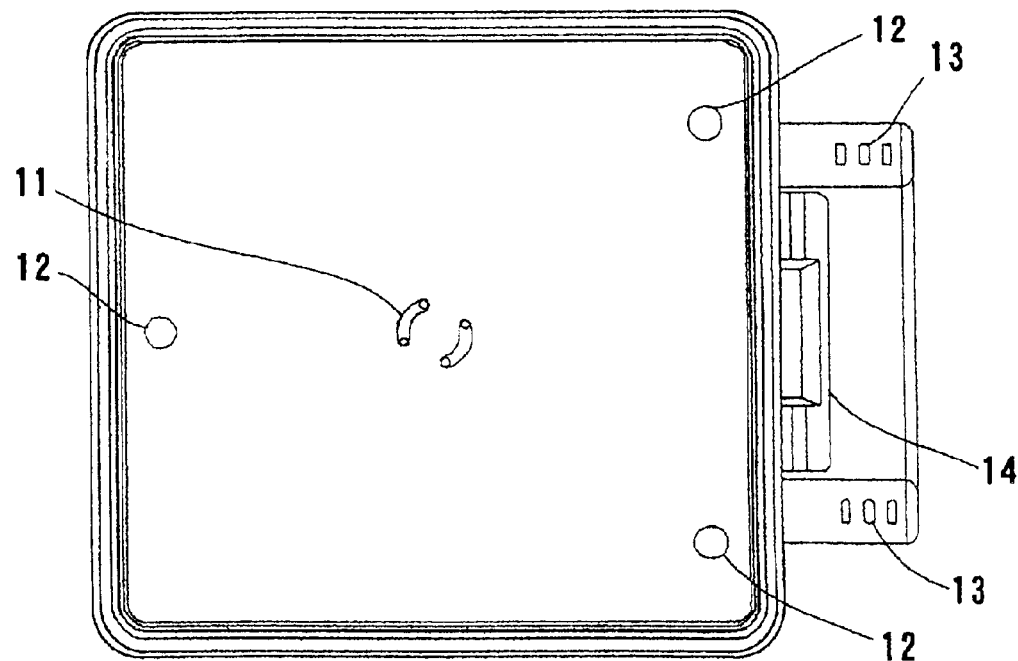
FIG. 3 is a bottom view of the substrate carrier container shown in FIG. 1.

First, a substrate carrier container to which electric power is to be supplied by a power supply apparatus will be described below with reference to FIGS. 1 through 3.

A plurality of semiconductor substrates W to be processed, each having a diameter of 200 mm, for example, are accommodated in a substrate cassette 4, and the substrate cassette 4 is housed in a container 10. The substrate carrier container serves to store and carry the substrates. As shown in FIGS. 1 through 3, the substrate carrier container 10 comprises a container body 1 in the form of a rectangular tube having an opening formed in a side wall thereof, a substrate loading/unloading door 2 coupled to an automatic door opening/closing device for mechanically opening and closing an opening formed in the lower surface of the container body 1, a cover 3 for covering an opening portion for installation and removal of filters and a fan motor, a substrate cassette 4 for holding semiconductor substrates W therein, an ultra penetration air filter (ULPA filter) 5, a gas removal filter 6, a fan motor 7, a dehumidifying unit (dehumidifying device) 8, a secondary cell for energizing the fan motor 7 and the dehumidifying unit 8, and an operation control board 9 for controlling operation of the fan motor 7 and the dehumidifying unit 8. As shown in FIG. 3, on the bottom of the substrate carrier container 10, there are provided a latch mechanism 11 for mechanically opening and closing the substrate loading/unloading door 2, and charging terminals (power supply terminals) 13 for the secondary cell. A plurality of positioning holes 12 are formed in the lower surface of the substrate carrier container 10.

In the present embodiment, the charging terminals 13 for the secondary cell in the substrate carrier container 10 are provided on the lower surface of the substrate carrier container 10. However, a charging terminal for the secondary cell may be provided on the side wall or the upper surface of the substrate carrier container 10. For reference, an information storage device 14 for managing substrate lots is shown in FIGS. 1 through 3. In the present embodiment, the substrate loading/unloading door 2 is disposed on the lower surface of the substrate carrier container 10. However, a substrate loading/unloading door may be disposed on the side wall or the upper surface of the substrate carrier container 10. In the present embodiment, the semiconductor substrates W are held in horizontal planes. The semiconductor substrates W may be held in vertical planes.

Figure 4:
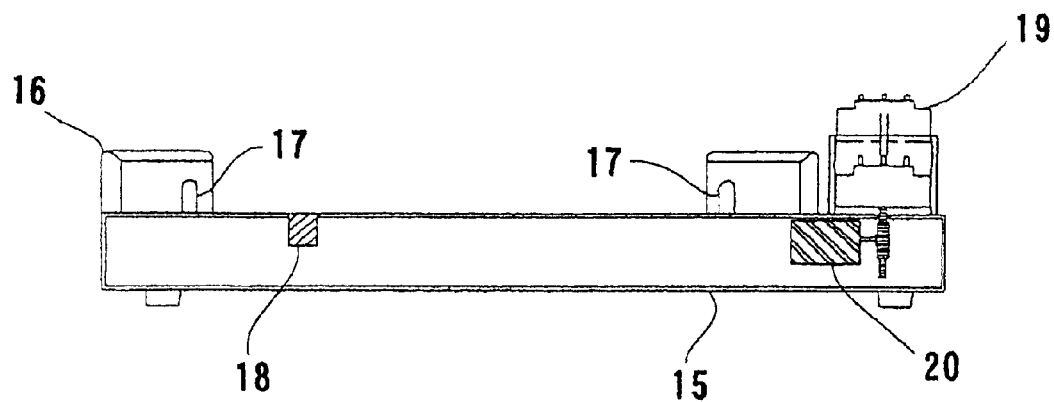
FIG. 4 is a cross-sectional side view showing a power supply apparatus according to an embodiment of the present invention.
Figure 5:
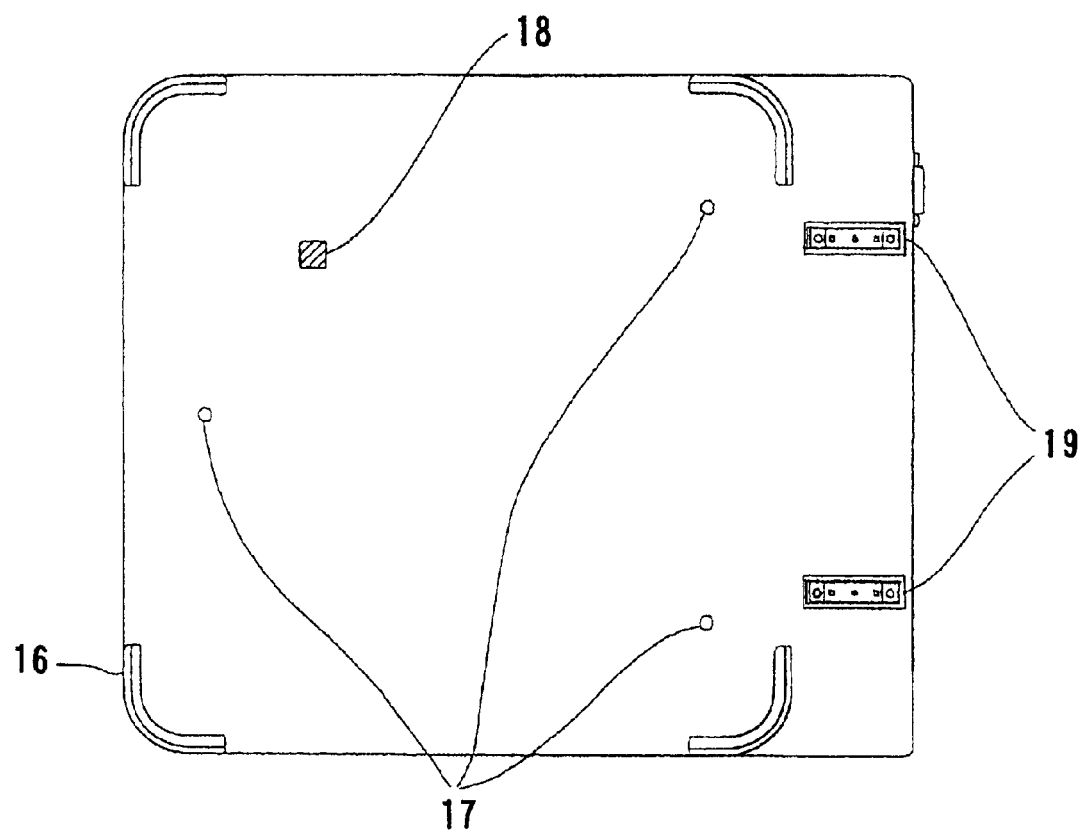
FIG. 5 is a plan view of the power supply apparatus shown in FIG. 4.

A power supply apparatus for charging the secondary cell provided in the substrate carrier container 10 serves to vertically receive the substrate carrier container 10 and charge the secondary cell in the substrate carrier container 10. The power supply apparatus is schematically shown in FIGS. 4 and 5. The power supply apparatus has a system for charging the secondary cell and a system for converting the voltage of commercial electric power into a predetermined voltage and supplying the converted electric power directly to the fan motor 7 and the dehumidifying unit 8. Since the commercial electric power is supplied directly to the fan motor 7 and the dehumidifying unit 8, the substrate carrier container 10 can continuously be operated for a long period of time. The power supply apparatus comprises a body 15, a plurality of guide members 16 for guiding the four corners of the bottom of the substrate carrier container 10, a plurality of positioning pins 17 for seating the substrate carrier container 10 in a predetermined position on the body 15 in cooperation with the guide members 16, a seating detecting device (detecting switch) 18 disposed in the body 15 for detecting whether the substrate carrier container 10 is seated on the body 15 or not, a charging connector (power supply connector) 19 vertically movably provided on the body 15, and a lifting and lowering mechanism 20 disposed in the body 15 for lifting and lowering the charging connector 19 based on detected information from the seating detecting device 18.

The power supply apparatus is not limited to a charger for charging a secondary cell or receiving electric power. The power supply apparatus includes a door opening apparatus with a charging function, a temporary storage apparatus with a charging function, a semiconductor fabrication apparatus with a charging function, an automatic transportation apparatus with a charging function, a manual transportation apparatus with a charging function, a performance checking apparatus with a charging function, and the like. In the present invention, the power supply apparatus is used in combination with the substrate carrier container having the secondary cell. However, the principles of the present invention are also applicable to a substrate carrier container having no secondary cell, i.e., a substrate carrier container equipped with an air cleaner or a dehumidifier that is operable with an external power source only.

Figure 6:
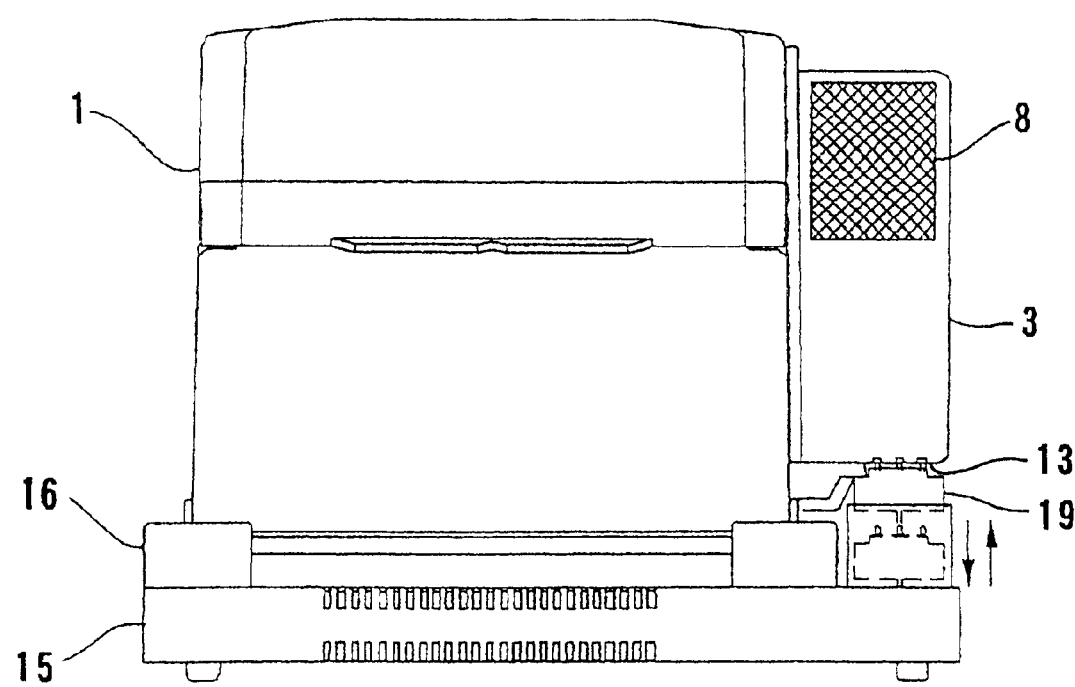
FIG. 6 is a side view of the substrate carrier container shown in FIG. 1 and the power supply apparatus shown in FIG. 4, on which the substrate carrier container is seated.

Operation of the components of the power supply apparatus for charging the secondary cell in the substrate carrier container 10 will be described below. When the substrate carrier container 10 is transported to the power supply apparatus, for charging, with a transportation machine such as an AGV or an OHT, the substrate carrier container 10 is seated in a predetermined position on the body 15 through the guide members 16 and the positioning pins 17, as shown in FIG. 6. When the substrate carrier container 10 is seated in the predetermined position on the body 15, the seating detecting device 18 detects the seating of the substrate carrier container 10 on the body 15. Then, the seating detecting device 18 operates the lifting and lowering mechanism 20 to lift the connector 19 mounted on the upper end of the lifting and lowering mechanism 20. The connector 19 is brought into contact with the charging terminals 13 provided on the bottom of the substrate carrier container 10, thereby starting the charging of the secondary cell in the substrate carrier container 10. When the charging of the secondary cell is completed or the substrate carrier container 10 is moved according to a substrate processing sequence, the seating detecting device 18 is turned off, and then the connector 19 is lowered by the lifting and lowering mechanism 20. The connector 19 comprises a spring-type connector, which is susceptible to mechanical shocks. Therefore, the connector 19 is retracted downwardly when the substrate carrier container 10 is not seated on the body 15 or the power supply of the power supply apparatus is turned off. In the present embodiment, the connector 19 is provided on the upper surface of th body 15. However, the connector 19 may be provided on the side surface or the like, as needed. The connector 19 is vertically movable in the present embodiment. However, the connector 19 may be moved in horizontal directions or oblique directions inclined relative to the vertical or horizontal directions. Alternatively, the horizontal movement, the vertical movement, the oblique movement, and the rotational movement may be combined with each other as needed.

The seating detecting device 18 may comprise a mechanical switch, a proximity switch, a photoelectric sensor, or the like. The mechanical switch is one of the most general detecting devices. The mechanical switch may comprise a push-button switch, a rotary switch, a slide switch, a joystick switch, a torque switch, or the like. A small-sized mechanical switch is also commercially available. The proximity switch detects approach of an object through a magnetic field or an electric field. The proximity switch, which is a non-contact-type detecting device, is effective in applications where an object to be detected is made of metal or nonmetal. The photoelectric sensor may comprise a diffuse reflection sensor, a mirror reflection sensor, a transmission sensor, or the like. The diffuse reflection sensor detects an object when the object is illuminated with light emitted from a light emitting element, and the light is diffused and reflected and partly returned to a light receiving element. In the mirror reflection sensor, light emitted from a light emitting element is reflected by a mirror and returned to a light receiving element. The mirror reflection sensor detects an object when the light between the mirror and the light receiving element is blocked by the object. In the transmission sensor, a light emitting element and a light receiving element are positioned in separate positions. The transmission sensor detects an object when light between the light emitting element and the light receiving element is blocked by the object. One of the aforementioned switches and sensors may be selected in consideration of their dimensions, shapes, prices, and reliability levels.

The connector 19 may comprise a fitting-type connector, a clip-type connector, or a contact-type connector. The fitting-type connector has such a structure that a plug and a socket are fitted into each other. The fitting-type connector is widely used with power supply cables and communication cables. The fitting-type connector is one of the most reliable connectors in applications where the plug is not frequently inserted into and removed from the socket. The clip-type connector is often used for temporary connection. The clip-type connector operates by clipping a conductor, and is less suitable for use as the connector 19 in the present embodiment. The contact-type connector generally has such a structure that a spring and a flat plate are brought into point contact with each other for conduction. The contact-type connector is effective in applications where only a small space is available for placing the connector. The spring of the contact-type connector may comprise a leaf spring or a coil spring, and many kinds of contact-type connectors with leaf springs and coil springs are available. In the present embodiment, the fitting-type connector or the contact-type connector is more effective than the clip-type connector, and the contact-type connector is more preferable from the viewpoint of saving space.

The air cleaner incorporated in the substrate carrier container 10 will be described below. The air cleaner comprising a particle removal filter and an air blower including a fan motor is generally used to reliably reduce contaminants and widely used in a semiconductor fabrication apparatus or a clean room. The particle removal filter may comprise a coarse particle filter, a medium efficiency particulate filter, a high efficiency particulate air filter (HEPA filter), or a ULPA filter. The particle removal filter may be selected depending on the desired cleanliness level. A gas removal filter may also be used for the air cleaner. The gas removal filter may be made of an adsorbing or absorbing material depending on the substance to be removed. For example, an acid gas, a basic gas, boron, phosphor, or the like can efficiently be removed with the use of an ion exchange resin, an ion exchange nonwoven fabric, or impregnated carbon with an acid or an alkali. Organic substances can be removed with the use of activated carbon, activated carbon fiber, zeolite, molecular sieve, silica gel, or porous ceramics. Ozone can be removed with the use of a medium carried or impregnated with particulate or sheet-like manganese dioxide. A suitable gas removal filter of an adsorbing material may be selected depending on the substance to be removed, the allowable filter dimensions, shape, and pressure loss.

Another method of removing contaminants employs ultraviolet photoelectrons. Specifically, ultraviolet rays emitted from an ultraviolet lamp are radiated to a photoemissive material to produce photoelectrons from the photoemissive material. The photoelectrons are used to ionize particles, and the ionized particles are caught by a trapping electrode for removal. Ultraviolet photoelectrons may be combined with a photocatalyst for decomposing and removing organic substances. In this method, a slight temperature difference is caused by the ultraviolet radiation for forming natural convection, and ventilation is performed by the natural convection. Therefore, a clean space can be produced without the need for a forced ventilation device such as a fan motor, which causes gaseous contaminants. The contaminant removal process using ultraviolet photoelectrons employs electrical components such as an ultraviolet lamp, and is effective to clean the air.

The dehumidifying unit 8 will be described below. Humidity in air may be lowered by a dehumidifying agent composed of silica gel, calcium chloride, or magnesium chloride, as a main component. In the case of such a dehumidifying agent, it is preferable to use a material such as silica gel that can be reused by heated elimination. The dehumidifying agent may also be cooled to condense moisture therein into dew and recover the dew condensation. The dehumidifying unit may employ a solid high polymer electrolyte membrane. In the dehumidifying unit with the solid high polymer electrolyte membrane, a DC voltage is applied to the solid high polymer electrolyte membrane to decompose water molecules in a space to be dehumidified into hydrogen and oxygen in the presence of a catalyst, and to discharge the hydrogen out of the space for thereby dehumidifying the space. This type of dehumidifying unit also needs to be supplied with electric power from the secondary cell. Any type of other dehumidifying units may be used.

According to the present invention, as described above, when the substrate carrier container equipped with a secondary cell and an electrical component energized by the secondary cell or equipped with an electrical component energized by an external power source is seated on the power supply apparatus, the substrate carrier container seated on the power supply apparatus is detected by the seating detecting device, and thereafter the connector for supplying electric power is connected to the substrate carrier container. Therefore, the connector is prevented from being damaged, and reliable operation can be achieved.

Accordingly, when the secondary cell in the substrate carrier container is charged, or when the substrate carrier container is supplied with electric power, the substrate carrier container is free of troubles, so that stable operation can be established in the factory in which the substrate carrier container is used.

Although a certain preferred embodiment of the present invention has been shown and described in detail, it should be understood that various changes and modifications may be made therein without departing from the scope of the appended claims.

What is claimed is:

1. A power supply apparatus for supplying electric power to a substrate carrier container having a rechargeable cell, said power supply apparatus comprising:
   a body for seating a substrate carrier container thereon;
   a seating detecting device provided on said body, for detecting whether or not the substrate carrier container is seated on said body;
   a movable power supply connector provided on said body; and
   a control mechanism for bringing said power supply connector into contact with a charging terminal of the substrate carrier container to charge the rechargeable cell in the substrate carrier container in accordance with a detected signal from said seating detecting device.

2. A power supply apparatus according to claim 1, wherein said substrate carrier container has at least one of an air cleaner and a dehumidifying device disposed therein.

3. A power supply apparatus according to claim 1, wherein said seating detecting device comprises at least one of a mechanical switch, a proximity switch, and a photoelectric sensor.

4. A power supply apparatus for supplying electric power to a substrate carrier container having an electrical component energized by an external power source, said power supply apparatus comprising:
   a body for seating a substrate carrier container thereon;
   a seating detecting device provided on said body, for detecting whether or not the substrate carrier container is seated on said body;
   a movable power supply connector provided on said body; and
   a control mechanism for bringing said power supply connector into contact with a power supply terminal of the substrate carrier container to supply electric power to the electrical component in accordance with a detected signal from said seating detecting device.

5. A power supply apparatus according to claim 4, wherein the substrate carrier container has at least one of an air cleaner and a dehumidifier disposed therein.

6. A power supply apparatus according to claim 4, wherein said seating detecting device comprises at least one of a mechanical switch, a proximity switch, and a photoelectric sensor.

7. A method of supplying electric power to a substrate carrier container having a rechargeable cell, said method comprising:
   seating a substrate carrier container on a body of a power supply apparatus;
   detecting whether or not said substrate carrier container is seated on said body with a seating detecting device provided on the body;
   moving a power supply connector provided on said body so as to bring said power supply connector into contact with a charging terminal of said substrate carrier container;

charging said rechargeable cell in said substrate carrier container in accordance with a detected signal from said seating detecting device; and returning said power supply connector to an original position thereof after said rechargeable cell is charged.

8. A method of supplying electric power to a substrate carrier container having an electrical component energized by an external power source, said method comprising:

seating a substrate carrier container on a body of a power supply apparatus;

detecting whether or not said substrate carrier container is seated on said body with a seating detecting device provided on the body;

moving a power supply connector, provided on said body, to bring said power supply connector into contact with a power supply terminal of said substrate carrier container;

supplying electric power to said electrical component according to a detected signal from said seating detecting device; and returning said power supply connector to an original position thereof after the electric power is supplied to said electrical component.

* * * * *